United States Patent
Muraoka

(10) Patent No.: US 7,745,318 B2
(45) Date of Patent: Jun. 29, 2010

(54) SEMICONDUCTOR DEVICE AND MANUFACTURING METHOD THEREOF

(75) Inventor: Koichi Muraoka, Kanagawa-Ken (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 267 days.

(21) Appl. No.: 11/154,815

(22) Filed: Jun. 17, 2005

(65) Prior Publication Data

US 2006/0170017 A1  Aug. 3, 2006

(30) Foreign Application Priority Data

Jan. 28, 2005  (JP) .............................. 2005-020942

(51) Int. Cl.
*H01L 21/3205* (2006.01)
*H01L 21/4763* (2006.01)

(52) U.S. Cl. ................. 438/585; 257/288; 257/410

(58) Field of Classification Search ............. 257/288, 257/401, 901; 438/292–308, 216, 261, 287, 438/768, 785
See application file for complete search history.

(56) References Cited

U.S. PATENT DOCUMENTS 6,268,258 B1 *  7/2001  Joo et al. ..................... 438/381

FOREIGN PATENT DOCUMENTS

| JP | 3350246 | 4/1996 |
| JP | 2002-057154 | 2/2002 |
| JP | 2002-165470 | 6/2004 |

OTHER PUBLICATIONS

Kikuchi et al., Effects of H2O on atomic Hyrdrogen generation in Hydrogen Plasma Part 1, Jun. 1993, Jpn. J. Appl. Physics vol. 32, pp. 3120-3124.*
Chui et al.; "Germanium Mos Capacitors Incorporating Ultrathin High-κGate Dielectric"; IEEE Electron Device Letters, vol. 23, No. 8, pp. 473-475, (Aug. 2002).
Chi et al.; "Zirconia Grown by Ultraviolet Ozone Oxidation on Germanium (100) Substrates"; Journal of Applied Physics, vol. 96, No. 1, pp. 813-819, (Jul. 2004).
Office Action of Chinese Patent Application No. 2006/100069290 issued on Jul. 20, 2007.
Kikuchi et al., "Effects of $H_2O$ on Atomic Hydrogen Generation in Hydrogen Plasma," Jpn. J. Appl. Phys., vol. 32, Part 1, No. 6B., pp. 3120-3124 (1993).
Second Office Action mailed Mar. 21, 2008 from the Taiwanese Patent Office in Taiwanese Patent Application No. 2006100069290 and English translation thereof.
Notification of Reason for Rejection mailed Jun. 3, 2008, from Japanese Patent Office and English translation.

* cited by examiner

*Primary Examiner*—W. David Coleman
*Assistant Examiner*—Sonya D McCall-Shepard
(74) *Attorney, Agent, or Firm*—Finnegan, Henderson, Farabow, Garrett & Dunner, L.L.P.

(57) ABSTRACT

A method of manufacturing a semiconductor device includes forming a semiconductor layer containing a semiconductor material having a first oxide-generating Gibbs free energy required to become an oxide; forming a first material for a gate insulator on the semiconductor layer, said first material containing an element having a second oxide-generating Gibbs free energy required to become an oxide and becoming insulative when the element is oxidized or nitrided; and annealing the first material in an atmosphere containing hydrogen atoms, or heavy hydrogen atoms, and oxygen atoms in a temperature range where the first oxide-generating Gibbs free energy is equal to or higher than the second oxide-generating Gibbs free energy.

15 Claims, 13 Drawing Sheets

SEMICONDUCTOR DEVICE AND MANUFACTURING METHOD THEREOF

CROSS-REFERENCE TO RELATED APPLICATION

This application is based upon and claims the benefit of priority from the prior Japanese Patent Applications No. 2005-20942, filed on Jan. 28, 2005, the entire contents of which are incorporated herein by reference.

BACKGROUND OF THE INVENTION

1. Field of the Invention

The present invention relates to a semiconductor device and a manufacturing method thereof.

2. Background Art

Along with microminiaturization of semiconductor integrated circuits, MIS semiconductor elements are getting more and more miniaturized. ITRS (International Technology Roadmap for Semiconductors), 2003 Edition, predicts that EOT (Equivalent Physical Oxide Thickness) of gate insulators will be reduced to 0.7 nm or less in 2010 or later. To prevent leak current while employing so thin gate insulators thinned to this level, the use of highly dielectric metal insulators (High-k films) such as $ZrO_2$ and $HfO_2$ will be indispensable.

High-k films have many vacancies, for which oxygen atoms diffuse fast. Therefore, if a High-k film is formed as a gate insulator on a silicon substrate, $SiO_x$ will be produced along the interface between the silicon substrate and the gate insulator. In addition, when a gate electrode of polysilicon is formed on the gate insulator, $SiO_x$ will be produced along the interface between the gate insulator and the gate electrode. $SiO_x$ increases EOT and invites crystalline defects.

To cope with this problem, there is a proposal to use a MIS structure including a germanium substrate thermodynamically weaker in chemical reaction with High-k films than silicon and a metal as the gate electrode (see C.O. Chui et al., IEEE Electron Device Letter, 23, 473(2002)).

Although germanium is thermodynamically less reactive with High-k films than silicon, it forms a $GeO_2$ layer, which is low in thermal stability and low in dielectric constant, along the interface between such a High-k film and the germanium substrate. The $GeO_2$ layer invites an increase of EOT (see D. Chi et al., 3. Appl. Phys., 96, 813(2004)). Furthermore, easy-to-oxidize metals undesirably react with High-k films. Oxygen atoms from the High-k film diffuse into an easy-to-oxidize metal. Therefore, if a metal is used as the gate electrode, a metal oxide layer is formed along the interface between the High-k film and the gate electrode. When oxygen atoms diffuse from the High-k film, vacancies in the High-k film increase. This results in increasing the leak current and degrading the reliability.

Here is a need for a semiconductor device having a gate insulator suppressed in thermal reaction with a semiconductor layer and in thermal reaction with a gate electrode, thereby reduced in leak current and EOT.

SUMMARY OF THE INVENTION

An advantage of an aspect of the present invention is to provide a semiconductor device having a gate insulator suppressed in thermal reaction with a semiconductor layer and in thermal reaction with a gate electrode, and thereby reduced in leak current and EOT.

A method of manufacturing a semiconductor device according to an embodiment of the present invention comprises forming a semiconductor layer containing a semiconductor material having a first oxide-generating Gibbs free energy required to become an oxide;

forming a first material for a gate insulator on the semiconductor layer, said first material containing an element having a second oxide-generating Gibbs free energy required to become an oxide and becoming insulative when the element is oxidized or nitrided; and annealing the first material in an atmosphere containing hydrogen atoms, or heavy hydrogen atoms, and oxygen atoms in a temperature range where the first oxide-generating Gibbs free energy is equal to or higher than the second oxide-generating Gibbs free energy.

A semiconductor device according to an embodiment of the present invention comprises a semiconductor layer containing a semiconductor layer containing a semiconductor material having a first oxide-generating Gibbs free energy required to become an oxide; and a gate insulator formed on the semiconductor layer and containing hydrogen or heavy hydrogen atoms, oxygen atoms, and, an element having a second oxide-generating Gibbs free energy equal to or lower than the first oxide-generating Gibbs free energy, the element becoming insulative when the element is oxidized or nitrided.

DETAILED DESCRIPTION OF THE INVENTION

Some embodiments of the present invention will now be explained below with reference to the drawings. These embodiments, however, should not be construed to limit the invention.

First Embodiment

Figure 1:
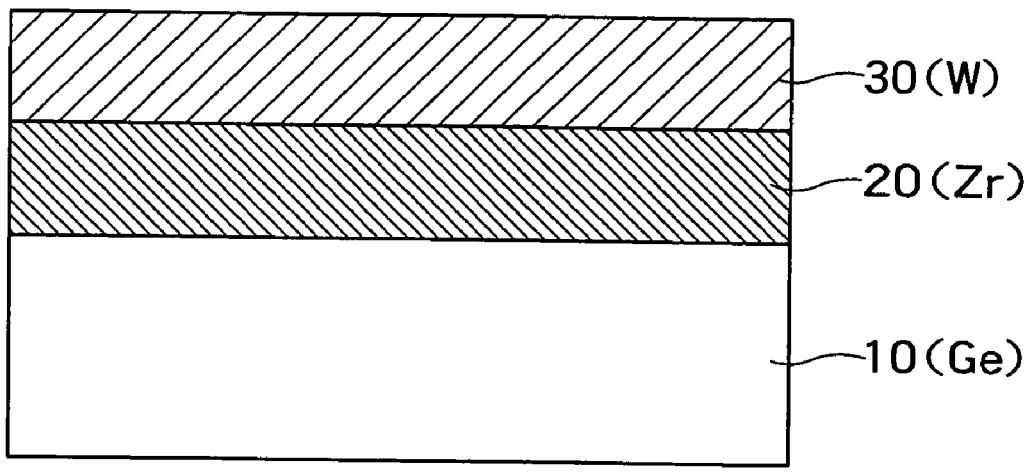
FIG. 1 is a cross-sectional view showing a manufacturing method of a semiconductor device according to the first embodiment of the invention.
Figure 2:
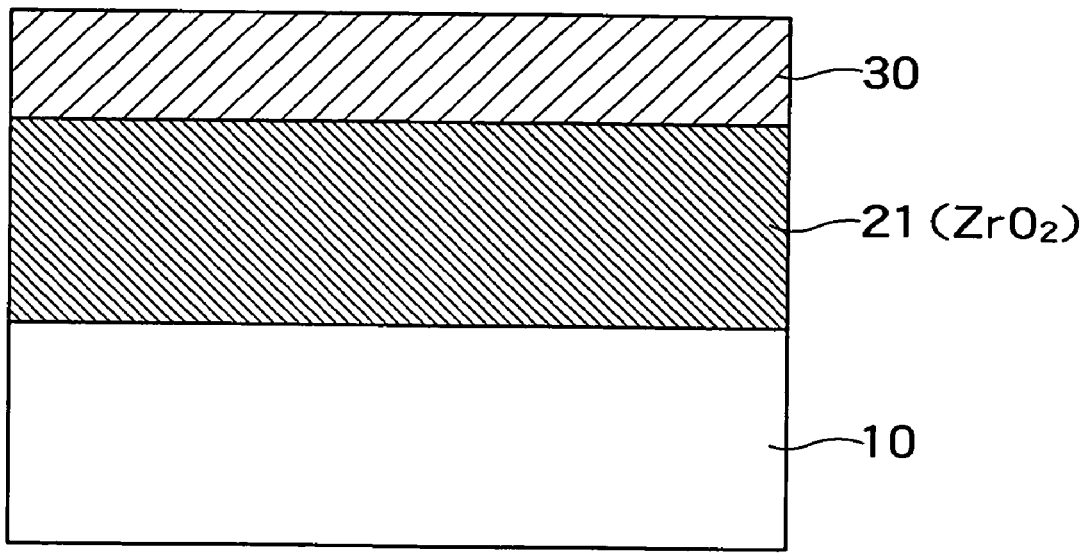
FIG. 2 is a cross-sectional view showing a manufacturing method of a semiconductor device according to the first embodiment of the invention.

FIGS. 1 and 2 are cross-sectional views showing a manufacturing method of a semiconductor device according to the first embodiment of the invention. This embodiment is directed to a manufacturing method of a semiconductor device having a MIS (Metal Insulator Semiconductor) structure.

A natural oxide film is removed from the surface of a single-crystal germanium (Ge) substrate 10. As shown in FIG. 1, next deposited on the germanium substrate 10 is a zirconium film 20 as a first material for a gate insulator. Subsequently, a tungsten (W) film 30 is deposited as a second material for a gate electrode on zirconium film 20. Thickness of the tungsten film 30 is preferably equal to or less than 20 nm to permit hydrogen and oxygen to diffuse into the zirconium film 20 through the tungsten film 30. This will be explained later in greater detail with reference to FIGS. 16 and 17. For example, the zirconium film 20 and the tungsten film 30 may be 2 nm thick approximately.

After that, the structure is annealed in an atmosphere containing hydrogen and water vapor. Depending upon the annealing conditions used, the zirconium film 20 alone can be selectively oxidized. As a result, an zirconium oxide ($ZrO_2$) film 21 is formed as shown in FIG. 2.

The annealing condition of the germanium substrate 19 is explained hereunder.

Figure 3:
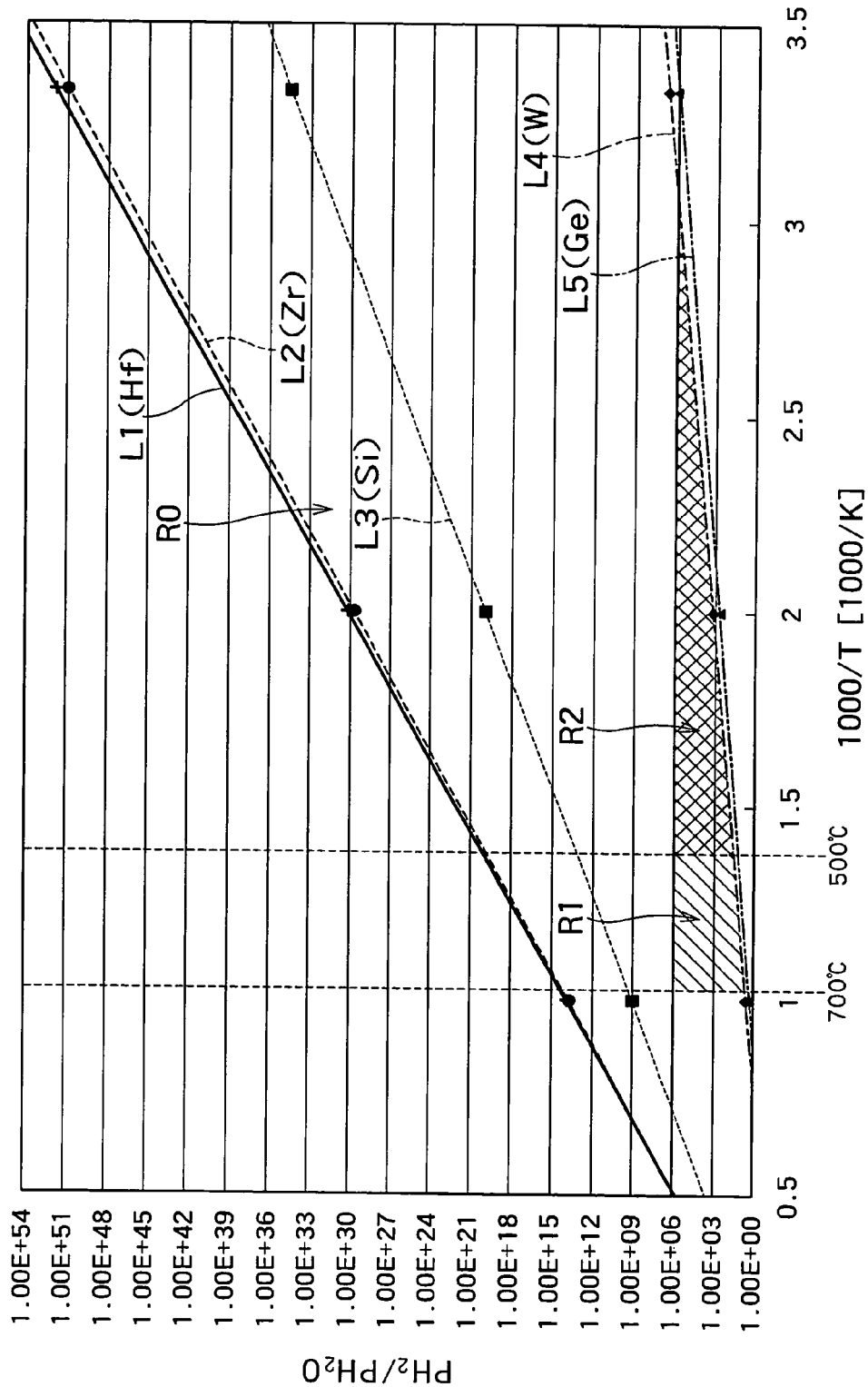
FIG. 3 is a graph showing borders of oxidization-reduction reaction.

FIG. 3 is a graph showing borders of oxidization-reduction reaction. The ordinate of the graph represents the ratio of partial pressures of hydrogen and water vapor ($PH_2/PH_2O$). The abscissa shows 1000/temperature T.

Let $\Delta G(T)$ represent the Gibbs free energy required for a certain material to be oxidized at the temperature T (Kelvin). Gibbs free energy $\Delta G(T)$ in the equilibrium state of oxidation-reduction reaction of a material M generally expressed by the Chemical Equation

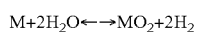

is defined by the following Equation 1.

$$\Delta G(T) = -RT\ln\left(\frac{P_{H_2}}{P_{H_2O}}\right)^2 \quad (1)$$

R is the gas constant. The Gibbs free energy $\Delta G(T)$ is a function of the annealing temperature T. With the temperature T determined, the Gibbs free energy $\Delta G(T)$ can be obtained. With the Gibbs free energy $\Delta G(T)$ and the temperature T substituted into Equation 1, the partial pressure ratio ($PH_2/PH_2O$) can be obtained. Under the condition smaller than the partial pressure ratio ($PH_2/PH_2O$), oxidation takes place. Under the condition larger than the partial pressure ratio ($PH_2/PH_2O$), deoxidization takes place.

FIG. 3 shows Gibbs free energy $\Delta G(T)$ in case of the material M being tungsten (W), zirconium (Zr), hafnium (Hf), silicon (Si) or germanium (Ge). In the upper-left region of each border line L1~L5 of oxidation-reduction reaction in the graph, the material M is deoxidized. In the lower-right region of each border line L1~L5, the material M is oxidized.

The borderline of oxidation-reduction reaction largely varies with the material M. Therefore, as shown in FIG. 3, there is the region R0 between the borderline L2 or L1 of oxidation-reduction reaction of zirconium (Zr) or hafnium (Hf) and the borderline L4 or L5 of oxidation-reduction reaction of tungsten (W) or germanium (Ge). This region R0 is the zone where zirconium (Zr) and hafnium (Hf) are oxidized but tungsten (W) and germanium (Ge) are not oxidized. The region R0 exists over the wide temperature range higher than the crossing point between L1, L2 and L4, L5.

Assume here that the oxide-generating Gibbs free energy of germanium is the fist oxide-generating Gibbs free energy $\Delta GS$, the oxide-generating Gibbs free energy of zirconium or hafnium is the second oxide-generating Gibbs free energy $\Delta GI$, and the oxide-generating Gibbs free energy of tungsten is the third oxide-generating Gibbs free energy $\Delta GM$.

By annealing the structure under the condition falling in the region R0 ($\Delta GI \leq \Delta GS$ and $\Delta GI \leq \Delta GM$), the zirconium film 20 can be oxidized selectively while the tungsten film 30 and the germanium film 10 are not oxidized. Further, by annealing the structure under a condition falling in the region R0, the tungsten film 30 and the germanium film 10 can be deoxidized. Thereby, it is possible to suppress generation of germanium oxide between the zirconium film 20 and the germanium film 10 and generation of tungsten oxide between the zirconium film 20 and the tungsten film 30.

It is usually difficult for semiconductor manufacturing devices for mass production to process semiconductor substrates under a partial pressure ratio ($PH_2/PH_2O$) exceeding $1 \times 10^6$. Therefore, the partial pressure ratio ($PH_2/PH_2O$) is preferably controlled not to exceed $1 \times 10^6$ (see Equation 3).

It is known that tungsten reacts with $H_2O$ and vaporizes at temperatures higher than 700° C. This invites the problem of contamination of the semiconductor manufacturing device used for selective oxidation by tungsten. Therefore, the annealing temperature of the germanium substrate 10 is preferably controlled not to exceed 700° C. (see Equation 4).

Considering desorption of GeO explained later in conjunction with the second embodiment, the temperature as the annealing condition is preferably controlled not to exceed 500° C. also in the first embodiment. Therefore, the annealing condition in the first embodiment is preferably controlled to fall in the region R2 of FIG. 3 (see Equation 4).

It is therefore desirable to anneal the germanium substrate 10 under a condition within the hatched region R1 or the crosshatched region R2 in FIG. 3. The optimum condition of this annealing can be expressed by Equations 2 to 4.

$$\exp\left(\frac{2\Delta G_{H_2O}(T) - \Delta G_I(T)}{2RT}\right) \geq \frac{P_{H_2}}{P_{H_2O}} \geq \qquad (2)$$
$$\exp\left(\frac{2\Delta G_{H_2O}(T) - \Delta G_M(T)}{2RT}\right) \approx \exp\left(\frac{2\Delta G_{H_2O}(T) - \Delta G_S(T)}{2RT}\right)$$

$$\frac{P_{H_2}}{P_{H_2O}} \leq 1E6 \qquad (3)$$

$$T \leq 700°\ C.(500°\ C.) \qquad (4)$$

ΔGI is the oxide-generating Gibbs free energy of an element contained in the gate insulator. ΔGM is the oxide-generating Gibbs free energy of an element contained in the gate electrode. ΔGS is the oxide-generating Gibbs free energy of an element contained in the semiconductor substrate. In this embodiment, the oxide-generating Gibbs free energy of zirconium (Zr) is ΔGI; the oxide-generating Gibbs free energy of tungsten (W) is ΔGM; and the oxide-generating Gibbs free energy of germanium is ΔGS. In addition, the water-generating Gibbs free energy is denoted by $GH_2O$.

Equation 2 defines the condition for selectively oxidizing the zirconium film 20 while deoxidizing the tungsten film 30 and the germanium substrate 10. According to Equation 2, the annealing condition is determined by relations among ΔGI, ΔGM and ΔGS. That is, the temperature range rendering ΔGS equal to or larger than ΔGI and rendering ΔGM equal to or larger than ΔGI is the preferable annealing condition. In an atmosphere held in this temperature range and containing both hydrogen and water vapor, the structure shown in FIG. 1 is annealed. Additionally, it is desirable to satisfy Equation 3 and Equation 4 as discussed above.

The semiconductor device manufactured according to the first embodiment includes the germanium substrate 10 as the semiconductor layer, a zirconium oxide film 21 as the gate insulator, and a tungsten film 30 as the gate electrode. The oxide-generating Gibbs free energy of germanium is ΔGS. The oxide-generating Gibbs free energy of zirconium is ΔGI smaller than ΔGS. In addition, since the zirconium oxide film 21 has been annealed in the atmosphere containing hydrogen and water vapor, it contains hydrogen atoms and oxygen atoms. The oxide-generating Gibbs free energy of tungsten is ΔGM larger than ΔGI. Like the zirconium film 21, the tungsten film 30 has been annealed in the atmosphere containing hydrogen and water vapor as well, and therefore contains hydrogen atoms and oxygen atoms.

Thus, the first embodiment can suppress generation of germanium oxide between the zirconium oxide film 21 and the germanium film 10 and generation of tungsten oxide between the zirconium oxide film 21 and the tungsten film 30. That is, the first embodiment suppresses thermal reaction between the germanium film 10 and the zirconium oxide film 21 and thermal reaction between the tungsten film 30 and the zirconium oxide film 21. As a result, the zirconium oxide film 21 reduced in leak current and EOT can be formed as the gate insulator between the germanium film 10 and the tungsten film 30.

Although the first embodiment has been explained as using the single-crystal germanium substrate 10 as the semiconductor layer, the zirconium film 20 as the first material for the gate insulator and the tungsten film 30 as the second material for the gate electrode, other materials combined to satisfy Equation 2 are usable as well.

Although the first embodiment uses zirconium as the first material for the gate insulator, the first material may be a hafnium film. That is, the gate insulator may be replaced by a hafnium oxide ($HfO_2$) film. Additionally, the first material for the gate insulator may contain at least one of Si, Ti, Al, La, Pr, Y, Ce, Sr, Dy, Er, Lu and Gd. Alternatively, the first material may be a silicate film, aluminate film, oxynitride film, nitride film, mixed film or multi-layered film containing at least one of Si, Zr, Hf, Ti, Al, La, Pr, Y, Ce, Sr, Dy, Er, Lu and Gd.

The first embodiment has been explained as using the single-crystal germanium substrate as the semiconductor layer. However, in lieu of the single-crystal germanium substrate, GOI (Germanium On Insulator) may be used as the semiconductor layer. The semiconductor layer may contain at least one of Ge, Ga and As. For example, gallium arsenide (GaAs) may be used in place of the germanium substrate.

Although the first embodiment has been explained as using tungsten as the gate electrode, it may be modified to use any of Pt, Au, Cu, Ta, Mo, Ir, Ru, Ni, Ge or GeAs, for example, instead of tungsten.

For deposition of the semiconductor layer, gate insulator and gate electrode, any technique such as sputtering, AL-CVD (Atomic Layer-CVD), vapor deposition or plasma CVD may be used.

Second Embodiment

Figure 4:
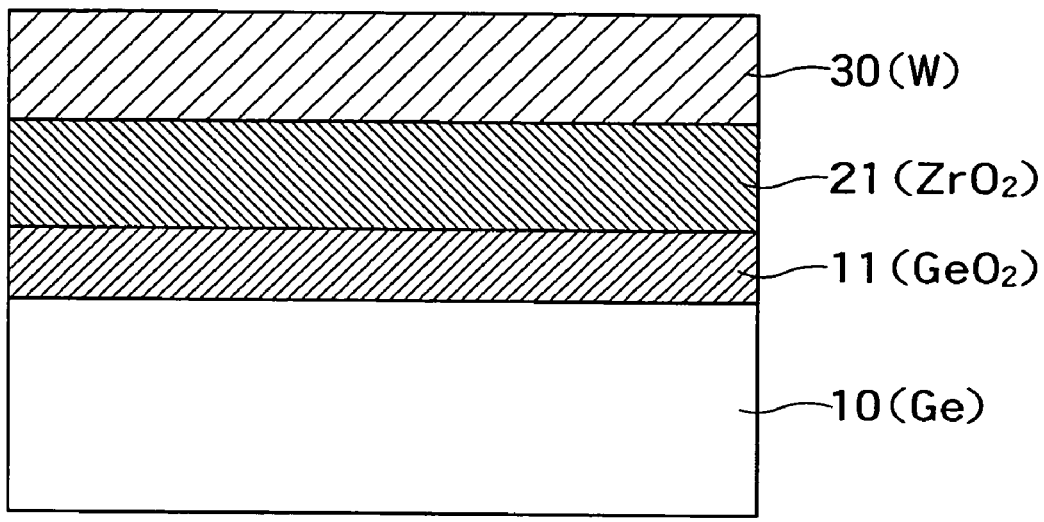
FIG. 4 is a cross-sectional view showing a method of manufacturing a semiconductor device according to the second embodiment of the invention.
Figure 5:
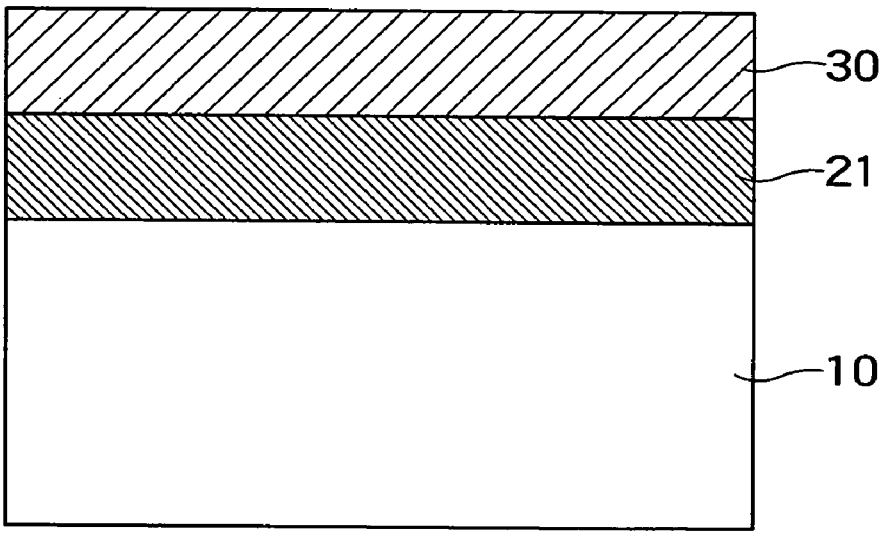
FIG. 5 is a cross-sectional view showing a method of manufacturing a semiconductor device according to the second embodiment of the invention.

FIGS. 4 and 5 are cross-sectional views showing a method of manufacturing a semiconductor device according to the second embodiment of the invention. As shown in FIG. 4, the zirconium oxide ($ZrO_2$) film 21 as the first material for the gate insulator is deposited on the germanium substrate 10. After that, the tungsten film 30 as the second material for the gate insulator is deposited on the zirconium oxide ($ZrO_2$) film 21.

In the second embodiment, since the zirconium oxide ($ZrO_2$) film 21 is deposited as the first material for the gate insulator, the first material for the gate insulator need not be oxidized selectively. However, once an oxide is deposited on the germanium substrate, the surface of the germanium substrate 10 is undesirably oxidized. As a result, as shown in FIG. 5, a germanium oxide ($GeO_2$) film 11 is undesirably formed between the germanium substrate 10 and the zirconium oxide film 21. Since the germanium oxide film 11 has a dielectric constant lower than the zirconium oxide film 21 and others, EOT of the gate insulator increases.

To cope with this problem, the second embodiment anneals the structure in an atmosphere containing hydrogen and water vapor. The annealing condition used here may be the same as that of the first embodiment. Thus, the germanium oxide film 11 is deoxidized to germanium. If the annealing temperature exceeds 500° C., germanium oxide is desorbed in form of germanium monoxide (GeO). This phenomenon has been confirmed by TDS (Thermal Desorption Spectroscopy). Desorption of GeO causes deterioration of the interface between the germanium substrate 10 and the zirconium oxide film 21. Desorption of GeO can be alleviated to a certain level by the zirconium oxide film 21 overlying the germanium substrate 10. Nevertheless, the annealing temperature is preferably controlled not to exceed 500° C. Thus, the annealing condition of the second embodiment is preferably controlled to fall within the region R2 of FIG. 3.

If the tungsten film 30 is oxidized by reaction with the zirconium oxide film 21, a tungsten oxide ($WO_2$) film (not shown) is formed along the interface between the tungsten film 30 and the zirconium oxide film 21. Here again, the annealing described above may be carried out to deoxidize the tungsten oxide film to tungsten.

The sum of the thickness of the zirconium oxide film 21 and the thickness of the tungsten film 30 is preferably controlled not to exceed 20 nm. This is desirable to permit hydrogen and oxygen to diffuse up to the germanium oxide film 11, penetrating the tungsten film 30 and the zirconium oxide film 21. Its details will be explained later with reference to FIGS. 16 and 17. For example, the zirconium oxide film 21 and the tungsten film 30 may be about 2 nm thick, respectively.

The second embodiment ensures the same effects as those of the first embodiment. That is, the second embodiment can suppress thermal reaction between the germanium film 10 and the zirconium film 20 and thermal reaction between the tungsten film 30 and the zirconium film 20, and can thereby make the gate insulator reduced in leak current and EOT.

The second embodiment has been explained as using the single-crystal germanium substrate 10 as the semiconductor layer, zirconium oxide film 21 as the first material for the gate insulator, and tungsten film 30 as the second material for the gate electrode. Instead, however, other materials are usable as well in combination satisfying Equation 2, like the first embodiment.

Third Embodiment

Figure 6:
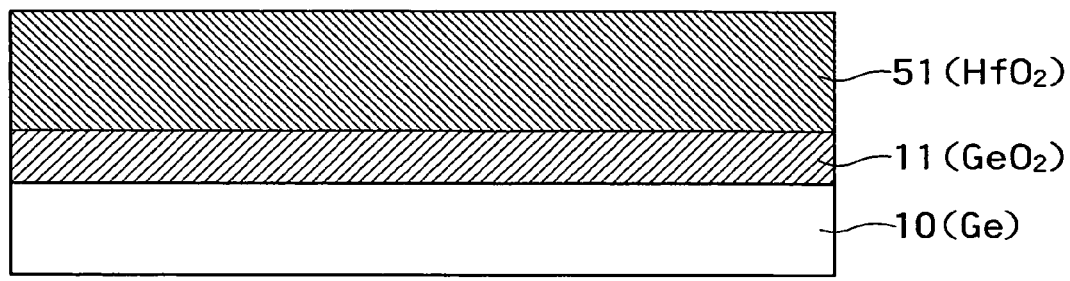
FIG. 6 is a cross-sectional view showing a manufacturing method of a semiconductor device according to the third embodiment of the invention.
Figure 7:
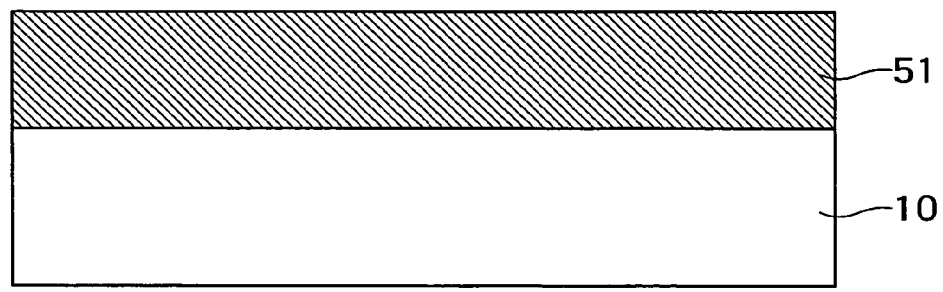
FIG. 7 is a cross-sectional view showing a manufacturing method of a semiconductor device according to the third embodiment of the invention.

FIGS. 6 and 7 are cross-sectional views showing a manufacturing method of a semiconductor device according to the third embodiment of the invention. As shown in FIG. 6, a hafnium oxide ($HfO_2$) film 51 is first deposited as the first material for the gate insulator on the germanium substrate 10. Subsequently, the tungsten (W) film 30 is deposited as the second material for the gate electrode on the hafnium oxide film 51. The hafnium oxide film 51 and the tungsten film 30 may be approximately 2 nm thick respectively.

Once the hafnium oxide film 51 is deposited on the germanium substrate 10, the germanium oxide ($GeO_2$) film 11 is undesirably formed along the interface between the germanium substrate 10 and the hafnium oxide film 51. For example, if the thickness of the hafnium oxide film 51 is 2 nm, the germanium oxide film 11 becomes 3 nm thick approximately. The germanium oxide film 11 has a lower dielectric constant than the hafnium oxide film 51. Therefore, EOT of the gate insulator increases.

To cope with this problem, the third embodiment anneals the structure in an atmosphere in which heavy water ($D_2O$) is discharged. When heavy water ($D_2O$) is discharged, heavy hydrogen (D) radicals, oxide heavy hydrogen (OD) radicals and oxygen (O) radicals are generated. D radicals deoxidize the material M. OD radicals and O radicals oxidize the material M. This oxidation-reduction reaction has the relation explained in conjunction with the first embodiment. Therefore, the temperature range, where $\Delta GS$ is equal to or larger than $\Delta GI$, and $\Delta GM$ is equal to or larger than $\Delta GI$, is the preferable annealing condition. Since radicals are very active, this temperature range is lower than the temperature range of the first embodiment. Thus, the third embodiment can absolutely disregard contamination by germanium.

Next deposited is a tungsten film (not shown) as the gate electrode, and the MIS structure is completed here. The hafnium oxide film 51 of the MIS structure contains heavy hydrogen atoms and oxygen atoms.

Figure 8:
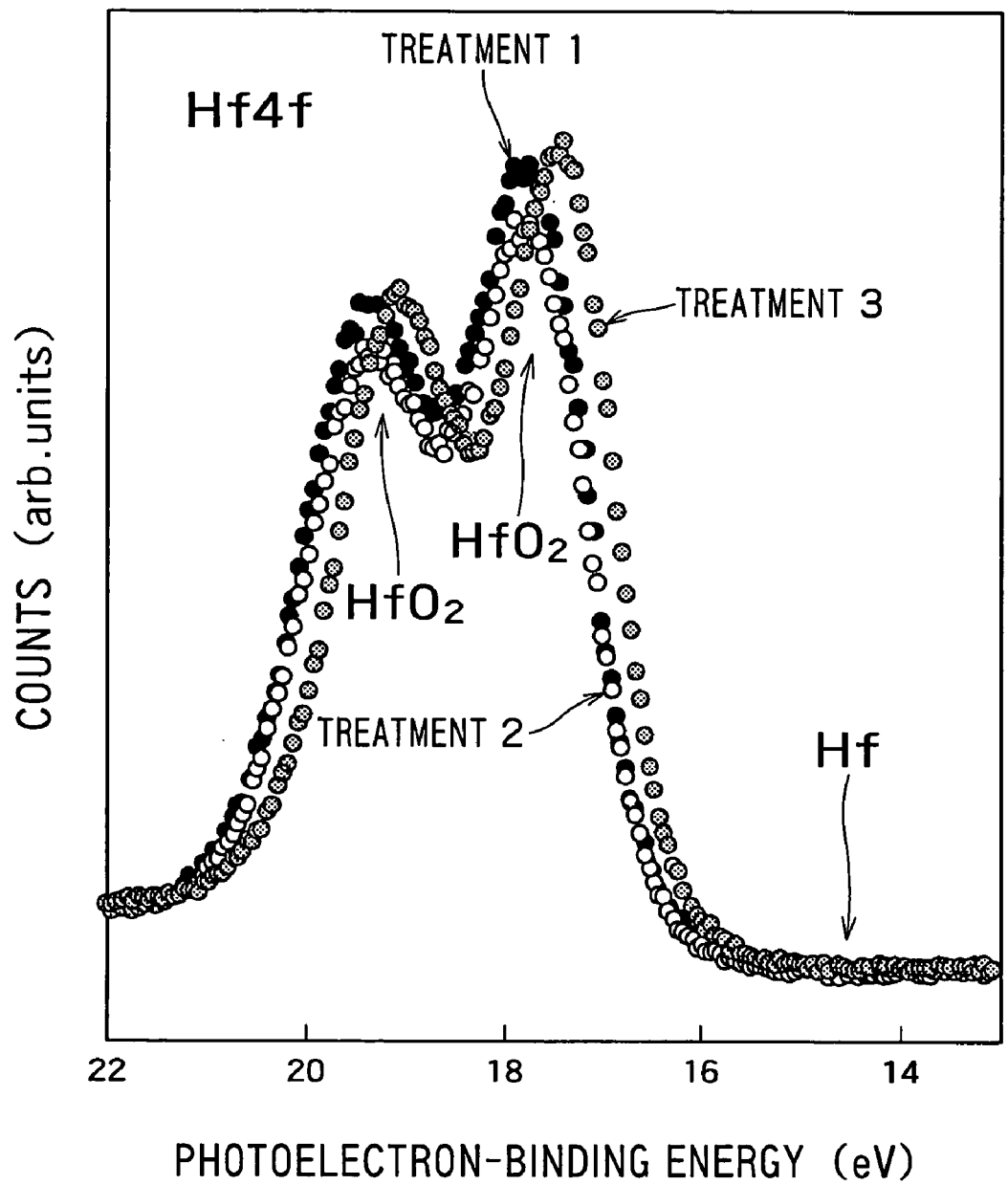
FIG. 8 is a graph showing results of XPS analysis of structures prepared from the structure shown in FIG. 6 through the treatments 1 to 3.
Figure 9:
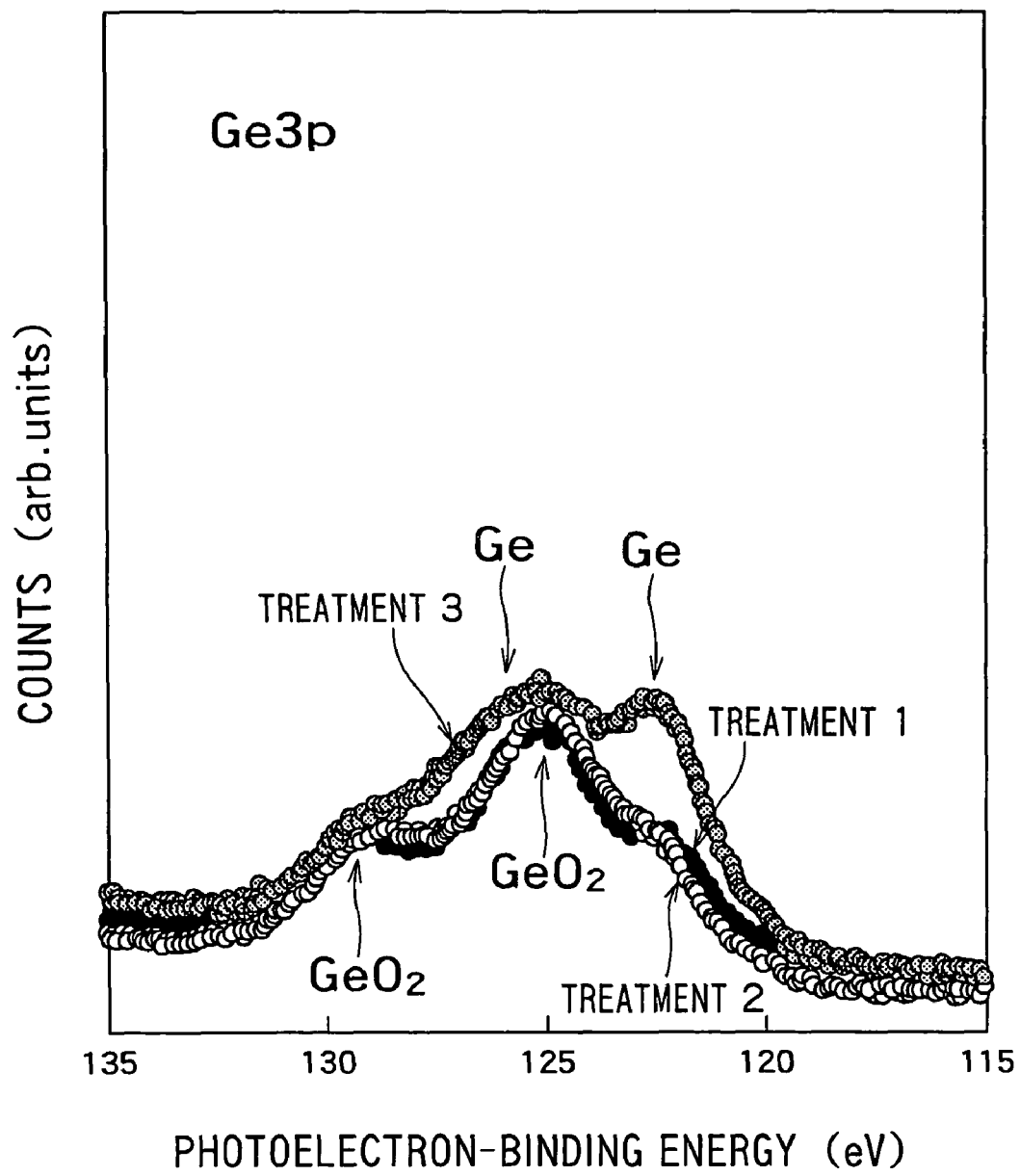
FIG. 9 is a graph showing results of XPS analysis of structures prepared from the structure shown in FIG. 6 through the treatments 1 to 3.

FIGS. 8 and 9 are graphs showing results of XPS (X-ray Photoelectron Spectroscopy) analysis of structures prepared from the structure shown in FIG. 6 through the following treatments 1 to 3. The graphs assign the abscissa to photoelectron-binding energy and the ordinate to the quantity of measured photoelectrons.

Treatment 1: After the structure of FIG. 6 was obtained, it was not annealed.

Treatment 2: After the structure was heated to 310° C. in a vacuum, $D_2O$ was introduced up to 20 mTorr, and the structure was annealed for 30 minutes. Thereafter, its temperature was decreased in a vacuum.

Treatment 3: After the structure was heated to 310° C. in a vacuum, $D_2O$ was discharged, and the structure was annealed for 30 minutes. The discharge was conducted under the condition of 2.45 GHz and 100 W after introduction of $D_2O$ up to 20 mTorr. Thereafter, the temperature is decreased in a vacuum. The discharge condition can be modified appropriately.

The XPS analysis was carried out under the condition of ex-situ XPS analysis (Hf4f, Ge3p), AlKα (14 kV, 400 W) and photoelectron-take-off-angle of 45°. XPS analysis demonstrates which elements a material is composed of.

In FIGS. 8 and 9, the graph of black plots shows the result of Treatment 1, the graph of white circles shows the result of Treatment 2, and the graph of gray plots shows the result of Treatment 3. As shown in FIG. 8, there is almost no change in shape of the peak of hafnium oxide ($HfO_2$) among treatments 1 to 3. This means that the hafnium oxide film 51 shown in FIG. 6 has not been deoxidized.

In FIG. 9, the graph of Treatment 2 shows almost no change from the graph of Treatment 1. In the graph of Treatment 3, however, the peak of germanium goes higher than those of Treatment 1 and Treatment 2. This means that the germanium oxide film 11 has been deoxidized to germanium. In FIG. 8, the peak of hafnium oxide ($HfO_2$) has shifted to the low energy side. This may allow the assumption that the band-bending amount of the germanium oxide film 11 electrically charged during the XPS measurement has been alleviated by reduction of the thickness of the germanium oxide film 11 existing along the interface between the hafnium oxide film 51 and the germanium substrate 10.

The third embodiment has been explained as annealing the structure in the radical atmosphere containing D atoms and O atoms exclusively. However, rare gas such as He, Ne, Ar, Kr, Xe, or the like, may be added. If Kr is added, for example, it promotes excitation of O radicals, and thereby terminates vacancies in the hafnium oxide film 51 efficiently.

Radicals may be generated by discharging a mixed gas of $D_2$ and $O_2$, mixed gas of $D_2$ and $D_2O$, mixed gas of $D_2$ and NO, or mixed gas of $D_2$ and $N_2O$. Alternatively, radicals generated by discharging $O_2$, $D_2O$, NO or $N_2O$ and radicals generated by discharging $D_2$ may be mixed.

D atoms diffuse in the film slower than H atoms due to the difference in atomic mass number between them. Therefore, D atoms make less defects in the film than H atoms. That is, the hafnium oxide film 51 shown in FIG. 7 exhibits a high electrical reliability to function as the gate insulator.

Although the third embodiment employs the annealing of a lower temperature than that of the first embodiment, it ensures the same effects as those of the first embodiment.

Fourth Embodiment

Figure 10:
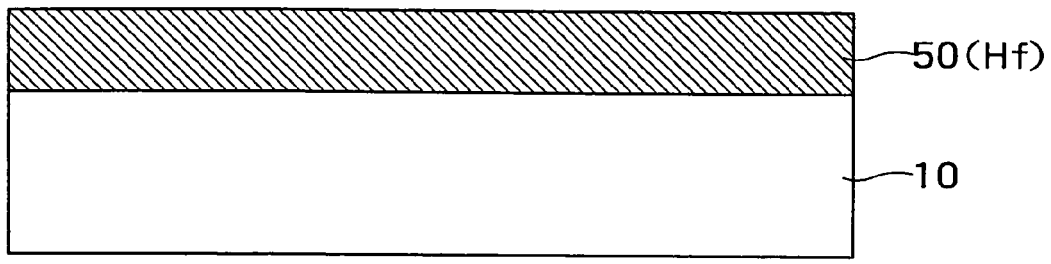
FIG. 10 is a cross-sectional view showing a manufacturing method of a semiconductor device according to the fourth embodiment of the invention.
Figure 11:
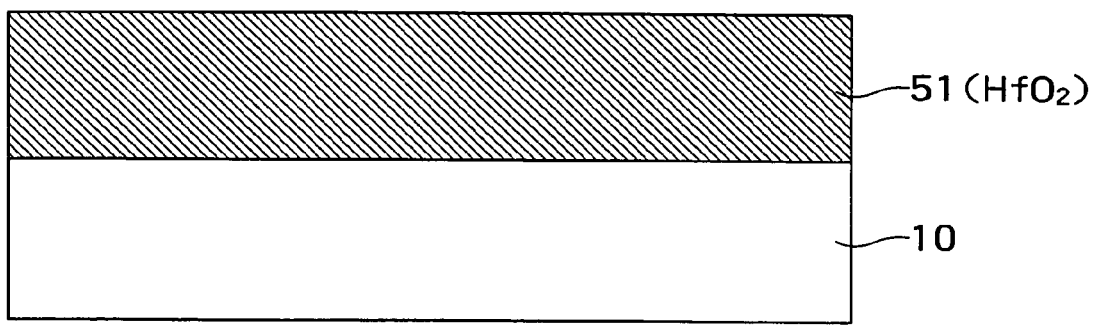
FIG. 11 is a cross-sectional view showing a manufacturing method of a semiconductor device according to the fourth embodiment of the invention.

FIGS. 10 and 11 are cross-sectional views showing a manufacturing method of a semiconductor device according to the fourth embodiment of the invention. As shown in FIG. 10, a hafnium (Hf) film 50 is deposited as the first material for the gate insulator on the germanium substrate 10.

Similarly to the third embodiment, the structure is annealed in an atmosphere in which heavy water ($D_2O$) is discharged. Thereby, the fourth embodiment can selectively oxidize the hafnium film 50 without oxidizing the germanium substrate 10. The hafnium film 50 may be 2 nm thick, for example.

After that, a tungsten film (not shown) is deposited as the gate electrode, and here is completed the MIS structure.

The fourth embodiment ensures the same effects as those of the third embodiment.

Fifth Embodiment

Figure 12:
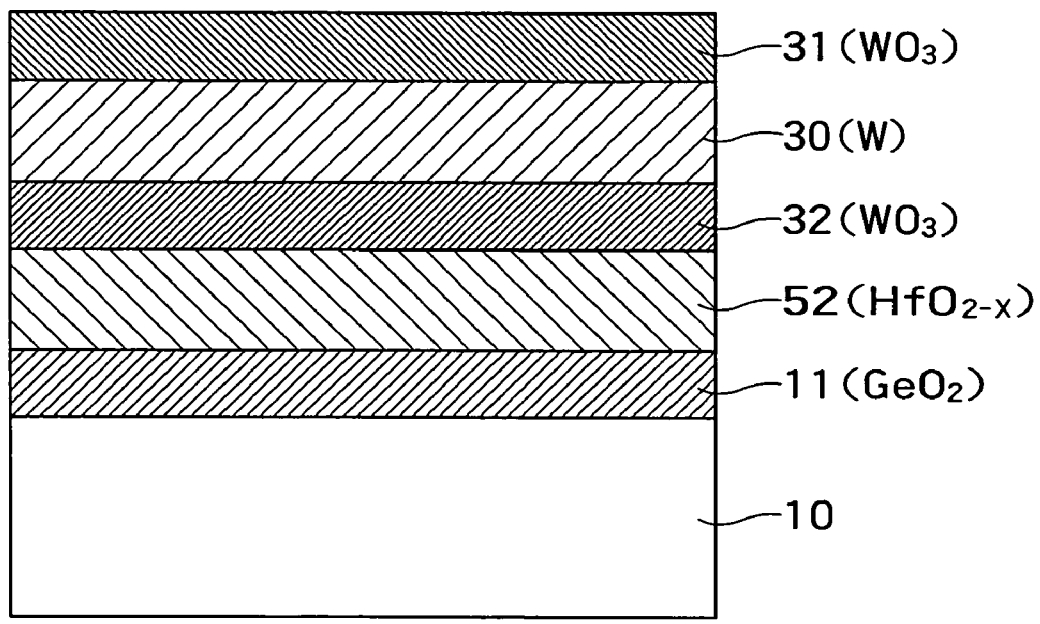
FIG. 12 is a cross-sectional view showing a manufacturing method of a semiconductor device according to the fifth embodiment of the invention.
Figure 13:
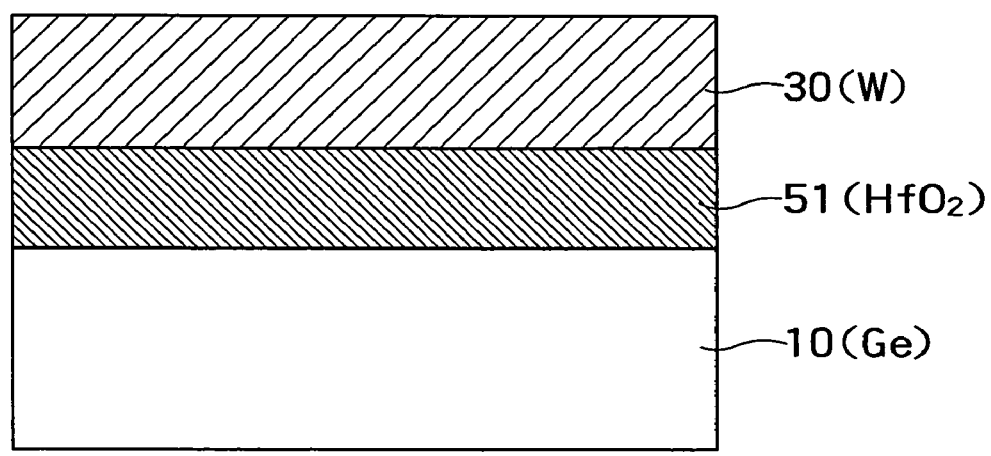
FIG. 13 is a cross-sectional view showing a manufacturing method of a semiconductor device according to the fifth embodiment of the invention.

FIGS. 12 and 13 are cross-sectional views showing a manufacturing method of a semiconductor device according to the fifth embodiment of the invention. A single-crystal germanium (Ge) substrate is first treated to remove the native oxide film from its surface. After that, a hafnium oxide ($HfO_2$) film is deposited as the first material for the gate insulator on the germanium substrate 10. Subsequently, a tungsten film 30 is deposited on the hafnium oxide film in the same processing chamber in-situ.

In the hafnium oxide ($HfO_2$) film, oxygen atoms are diffused as vacancies are formed. Thereby, the hafnium oxide ($HfO_2$) film changes to a hafnium oxide ($HfO_{2-x}$) 52, and oxidizes the materials in contact with the top and bottom surfaces thereof. That is, once the hafnium oxide ($HfO_2$) film is deposited on the germanium substrate 10, the germanium substrate 10 is oxidized. Thereby, a germanium oxide film 11 is formed along the interface between the hafnium oxide ($HfO_{2-x}$) film 52 and the germanium substrate 10. In addition, once the tungsten film 30 is deposited on the hafnium oxide ($HfO_2$) film, the tungsten oxide ($WO_x$) film 32 is formed along the interface between the hafnium oxide ($HfO_{2-x}$) film 52 and the tungsten film 30. Since the surface of the tungsten film 30 is exposed to the atmospheric air, a tungsten oxide ($WO_3$) film 31 is formed on the tungsten film 30.

The hafnium oxide ($HfO_2$) film and the tungsten film 30 are approximately 2 nm respectively. In this case, the germanium oxide film 11, tungsten oxide film 31 and tungsten oxide film 32 are approximately 3 nm respectively.

The structure is next annealed in an atmosphere in which water ($H_2O$) is discharged. Once water ($H_2O$) is discharged, H radicals, OH radicals and O radicals are generated. H radicals deoxidize the material M. OH radicals and O radicals oxidize the material M. This oxidation-reduction reaction has the relation already explained in conjunction with the first embodiment. Therefore, the temperature range in which $\Delta GS$ is equal to or larger than $\Delta GI$ and $\Delta GM$ is equal to or larger than $\Delta GI$ is the preferable annealing condition. The germanium oxide film 11 and the tungsten oxide films 31, 32 are selectively deoxidized by this annealing. In addition, since extra hafnium in the hafnium oxide film 52 is oxidized, the hafnium oxide ($HfO_{2-x}$) film 52 changes to the hafnium oxide ($HfO_2$) film 51. Thus, the MIS structure shown in FIG. 13 is completed.

Since the fifth embodiment can anneal the structure at a low temperature, it can disregard contamination by germanium absolutely. Additionally, here is the additional advantage that hydrogen atoms terminate defects of the interfacial level.

Figure 14:
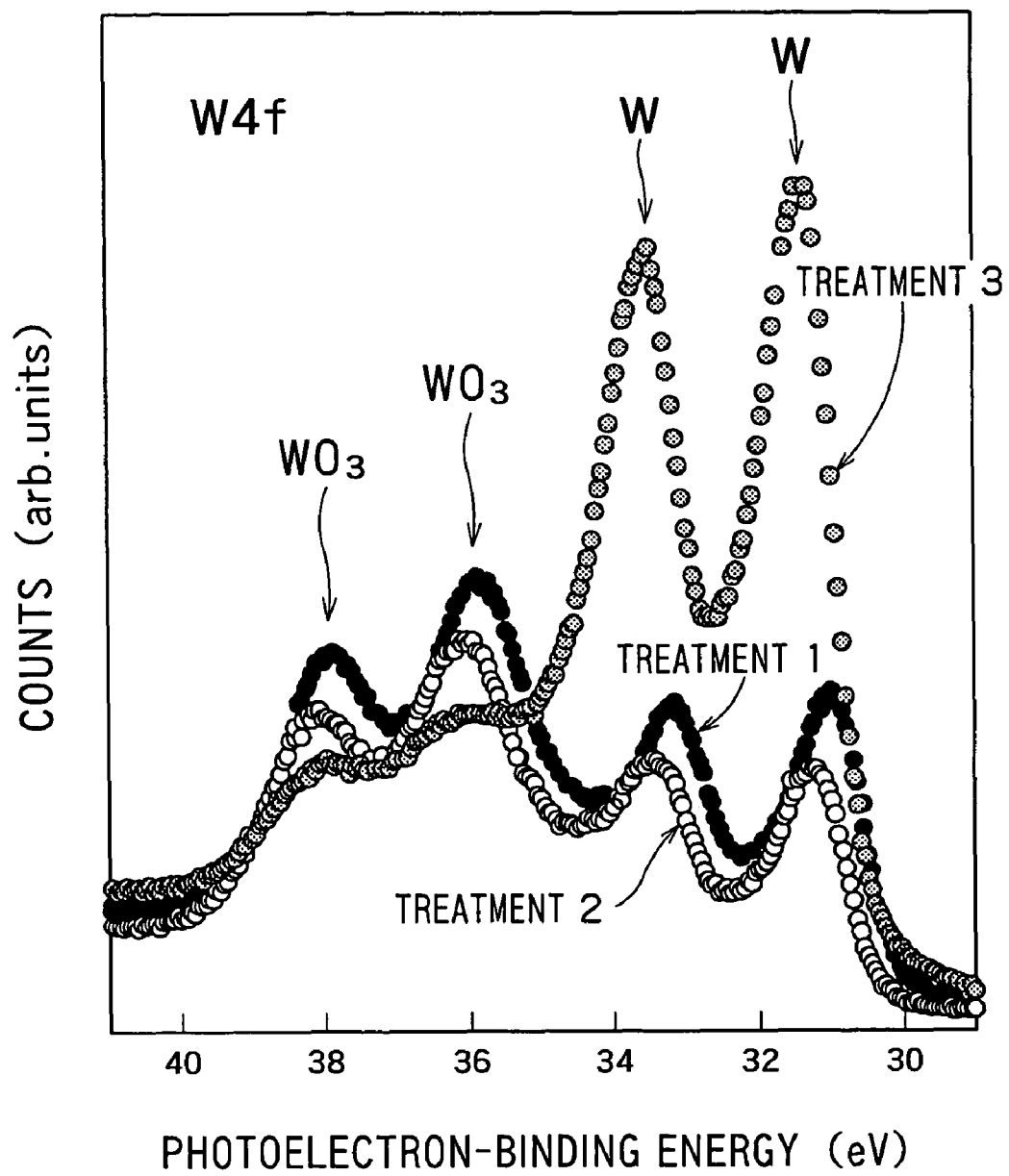
FIG. 14 is a graph showing results of XPS analysis of structures prepared from the structure shown in FIG. 12 through the treatments 1 to 3.
Figure 15:
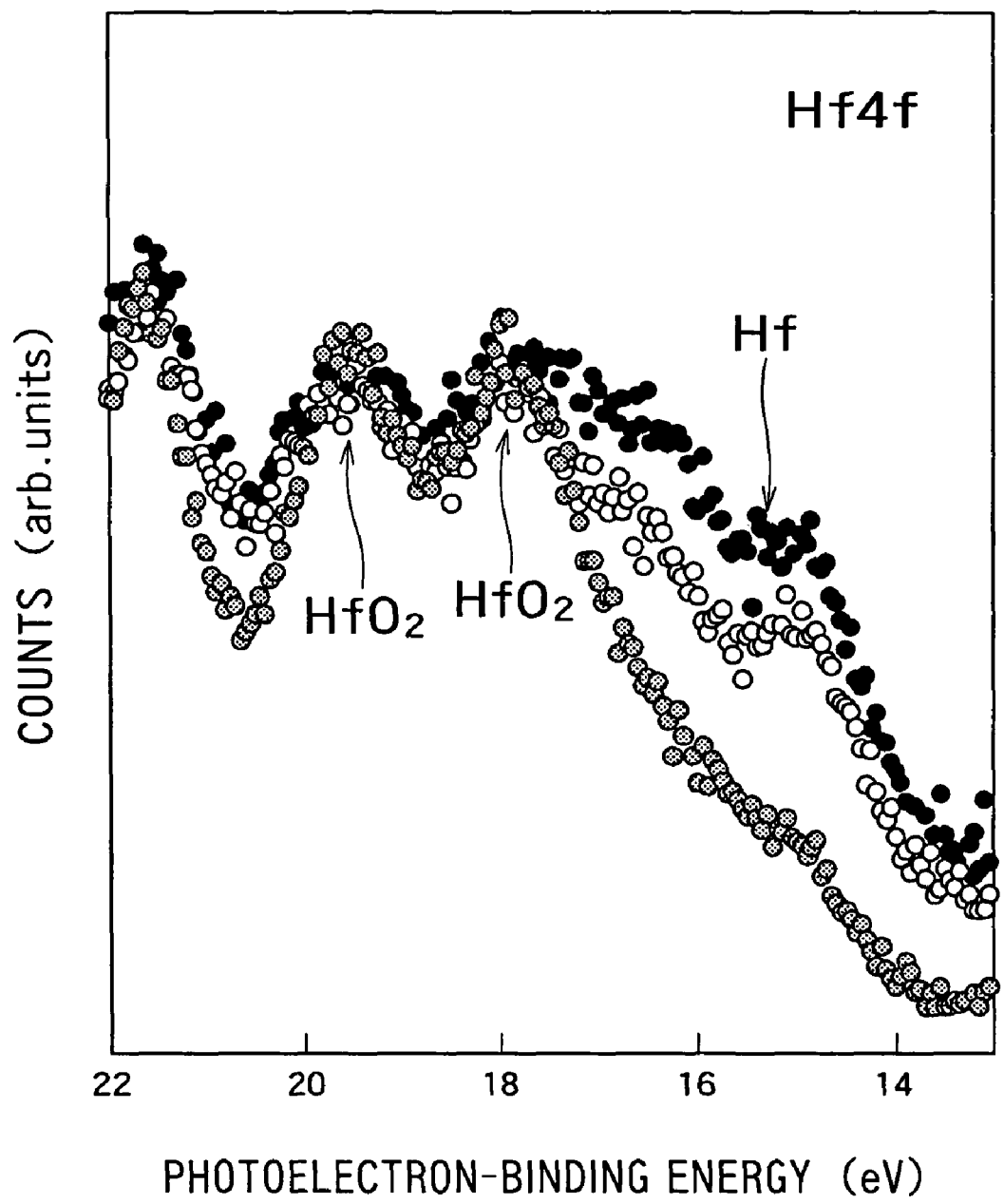
FIG. 15 is a graph showing results of XPS analysis of structures prepared from the structure shown in FIG. 12 through the treatments 1 to 3.

FIGS. 14 and 15 are graphs showing results of XPS analysis of structures prepared by applying the following treatments 1 to 3 to the structure shown in FIG. 12. The abscissa represents photoelectron-binding energy, and the ordinate represents the quantity of measured electrons.

Treatment 1: After the structure of FIG. 12 was obtained, it was not annealed.

Treatment 2: After the structure was heated to 310° C. in a vacuum, $H_2O$ was introduced up to 20 mTorr, and the structure was annealed for 30 minutes. Thereafter, its temperature was lowered in a vacuum.

Treatment 3: After the structure was heated to 310° C. in a vacuum, $H_2O$ was discharged, and the structure was annealed for 30 minutes. The discharge was conducted under the condition of 2.45 GHz and 100 W after introduction of $H_2O$ up to 20 mTorr. Thereafter, the temperature is decreased in a vacuum. The discharge condition can be modified appropriately.

The XPS analysis was carried out under the condition of ex-situ XPS (W4f, Hf4f), AlK$\alpha$ (14 kV, 400 W) and photo-electron-take-off-angle of 45°.

In FIGS. 14 and 15, the graph of black plots shows the result of Treatment 1, the graph of white circles shows the result of Treatment 2, and the graph of gray plots shows the result of Treatment 3. As shown in FIG. 14, Treatment 3 reduces tungsten oxide ($WO_x$) and increases tungsten (W). This means that the tungsten oxide ($WO_x$) film 32 and the tungsten oxide ($WO_3$) film 31 have been deoxidized to the tungsten (W) film 30. Further, as shown in FIG. 15, Treatment 3 reduces hafnium (Hf) components and increases hafnium oxide ($HfO_2$) components. This means that the hafnium oxide ($HfO_{2-x}$) film 52 has been oxidized to hafnium oxide ($HfO_2$). Although the drawings do not show, the germanium oxide ($GeO_2$) film 11 is deoxidized to germanium.

Figure 16:
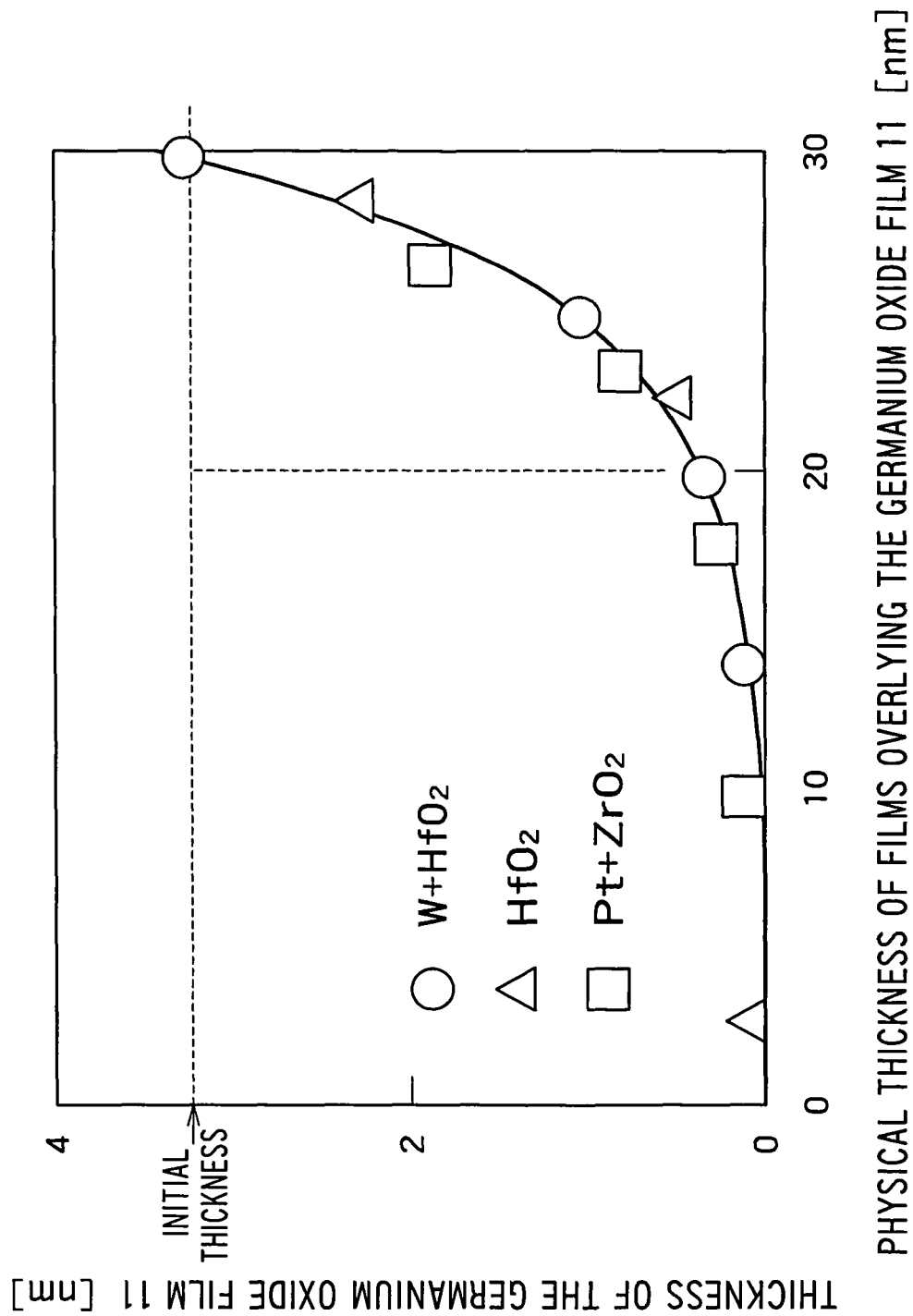
FIG. 16 is a graph showing the relation between the thickness of the germanium oxide film 11 and the thickness of the tungsten film 30 etc.

FIG. 16 is a graph showing the relation between the thickness of the germanium oxide film 11 and the thickness of the tungsten film 30. The abscissa represents the physical thickness of films overlying the germanium oxide film 11. Round plots show the relation established when the tungsten film 30 and the hafnium oxide ($HfO_2$) film overlie the germanium oxide film 11. Triangular plots show the relation established when the hafnium oxide ($HfO_2$) film alone overlies the germanium oxide film 11. Square plots show the relation established when a platinum (Pt) film and a zirconium oxide ($ZrO_2$) film overlie the germanium oxide film 11.

It is appreciated from FIG. 16 that the effect of deoxidization of the germanium oxide film 11 depends upon the sum of the thicknesses of all materials deposited on the germanium oxide film 11 regardless of their substances. That is, in the structure shown in FIG. 12, the result of deoxidization of the germanium oxide film 11 depends upon the sum of thicknesses of the tungsten film 30, tungsten oxide films 31, 32 and hafnium oxide ($HfO_{2-x}$) film.

It is also appreciated from FIG. 16 that almost all of the germanium oxide film 11 had been deoxidized when the total thickness of the materials deposited on the germanium oxide film 11 was equal to or less than 20 nm. Therefore, in the fifth embodiment, the sum of thicknesses of the tungsten film 30, tungsten oxide films 31, 32 and hafnium oxide ($HfO_{2-x}$) film is preferably controlled not to exceed 20 nm.

Figure 17:
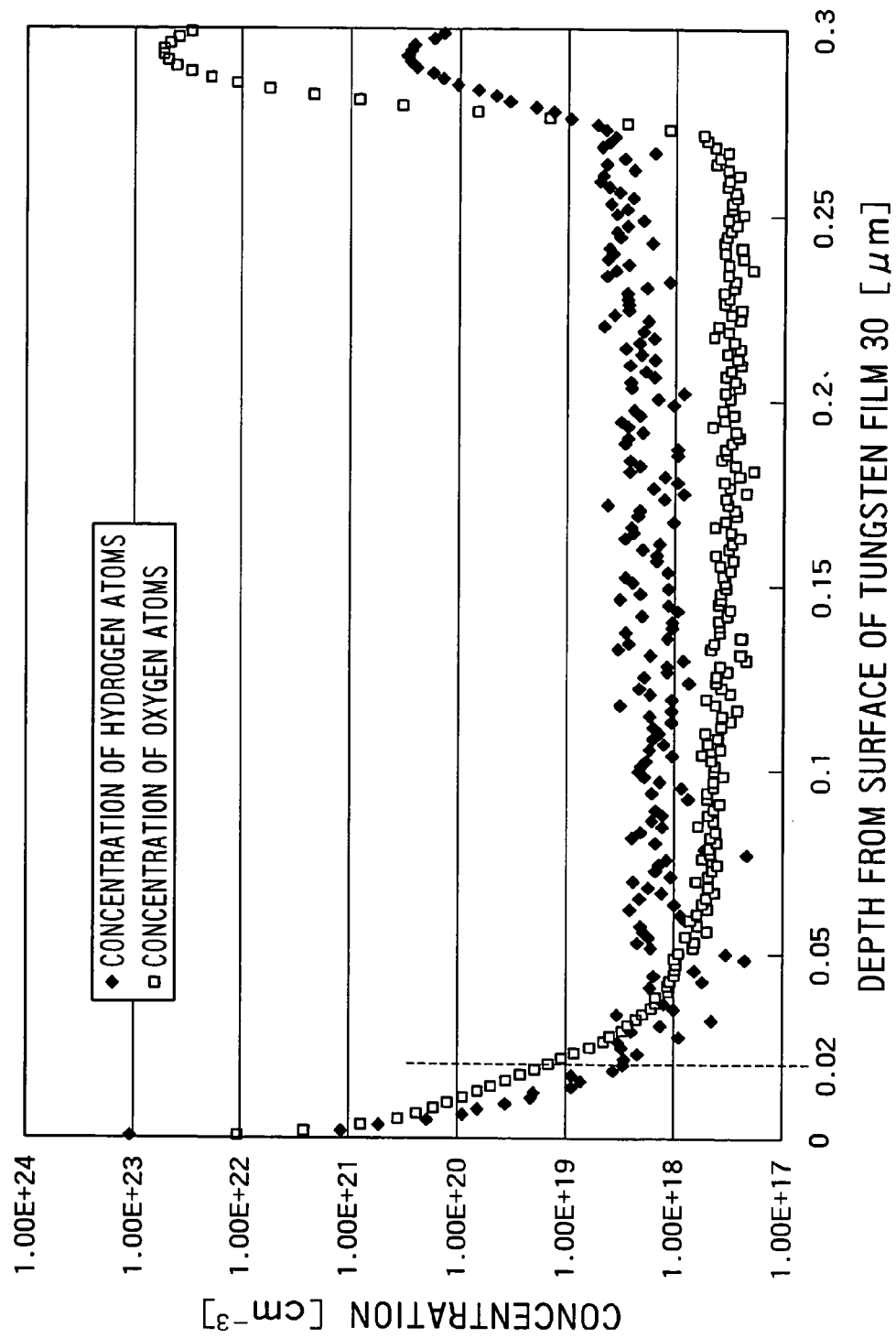
FIG. 17 is a graph showing the concentration profile of oxygen atoms and hydrogen atoms existing in the tungsten film 30 subjected to the annealing process using radicals.

FIG. 17 is a graph showing the concentration profile of oxygen atoms and hydrogen atoms (or heavy hydrogen atoms) existing in the tungsten film 30 subjected to the annealing process using radicals (see FIG. 13). This graph is the result of analysis by SIMS (Secondary Ion Mass Spectroscopy).

It has been confirmed that oxygen atoms and hydrogen atoms (or heavy hydrogen atoms) reach the background levels near 20 nm from the surface of the tungsten film 30. This demonstrates that hydrogen atoms (or heavy hydrogen atoms) and oxygen atoms diffuse to the depth of 20 nm by the above-explained annealing. As such, as shown in FIG. 17 as well, the sum of thicknesses of the tungsten film 30, tungsten oxide films 31, 32 and hafnium oxide ($HfO_{2-x}$) is preferably equal to or less than 20 nm.

Furthermore, by controlling the tungsten film 30 to contain both hydrogen atoms (or heavy hydrogen atoms) and oxygen atoms by $1 \times 10^{18}$ $cm^{-3}$ or more, it is possible to suppress the interfacial reaction with the gate electrode in manufacturing steps carried out after the gate electrode is formed.

The fifth embodiment has been explained as executing the annealing in a radical atmosphere containing H atoms and O atoms alone. However, $N_2$ gas may be added to the atmosphere. Discharge of $H_2O$ and $N_2$, for example, is effective to promote excitation of N radicals. Thereby, an electrically conductive tungsten nitride (WN) film can be formed without oxidizing the tungsten film 30. The tungsten nitride (WN) film suppresses diffusion of impurities.

Sixth Embodiment

Figure 18:
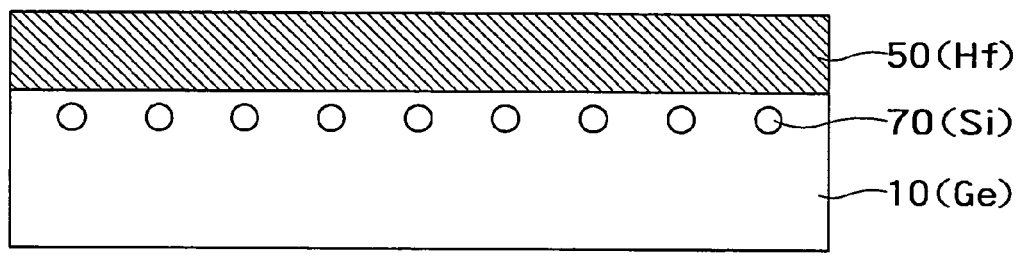
FIG. 18 is a cross-sectional view showing a manufacturing method of a semiconductor device according to the sixth embodiment of the invention.
Figure 19:
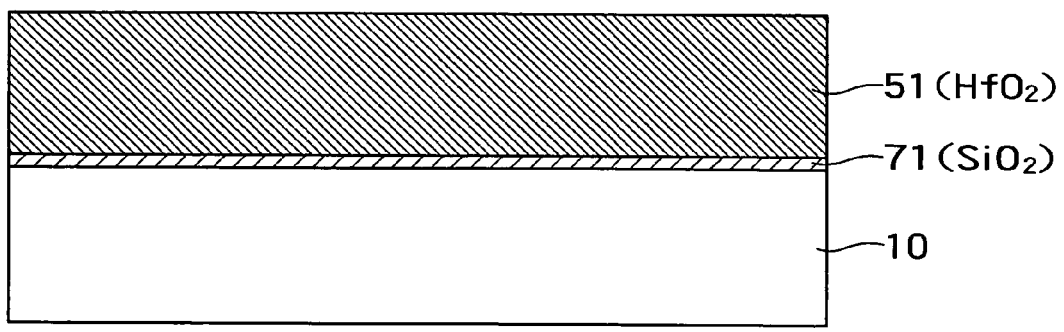
FIG. 19 is a cross-sectional view showing a manufacturing method of a semiconductor device according to the sixth embodiment of the invention.

FIGS. 18 and 19 are cross-sectional views showing a manufacturing method of a semiconductor device according to the sixth embodiment of the invention. As shown in FIG. 18, a germanium substrate 10 doped with silicon atoms 70 is prepared, and a hafnium film 50 is deposited on the germanium substrate 10. The hafnium film 50 is 2 nm thick, for example.

The structure shown in FIG. 18 is next annealed in an atmosphere in which a mixed gas of hydrogen and oxygen is discharged. Thereby, the hafnium film 50 and silicon atoms 70 alone can be selectively oxidized without oxidizing the germanium substrate 10. As a result, as shown in FIG. 19, a silicon oxide film 71 and a hafnium oxide film 51 are formed on the germanium substrate 10.

In the sixth embodiment, the silicon oxide film 71 is formed along the interface between the germanium substrate 10 and the hafnium film 50 by using radicals. Therefore, the silicon oxide film 71 is alleviated in plane orientation dependence. That is, the sixth embodiment can obtain a uniform silicon oxide film 71 regardless of the plane orientation of the germanium substrate 10, and can thereby form a reliable, very thin silicon oxide film 71.

Moreover, the sixth embodiment can control the thickness of the silicon oxide film 71 by controlling the quantity of silicon doped into the germanium substrate 10. Instead of doping silicon atoms into the germanium substrate 10, a SiGe layer having a silicon concentration gradient may be used as well.

Alternatively, a lutetium (Lu) film may be formed on a GaAs substrate doped with lanthanum (La), and may be subjected to the above-explained annealing. In this manner, lanthanum and lutetium are selectively oxidized and form a lanthanum oxide ($La_2O_3$) film and a lutetium oxide ($Lu_2O_3$) film on the GaAs substrate. As such, the sixth embodiment can make various MIS structures.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

The invention claimed is:

1. A method of manufacturing a semiconductor device comprising:

forming a first material for a gate insulator on a semiconductor layer, the semiconductor layer being made of germanium or gallium arsenide having a first oxide-generating Gibbs free energy required to become an oxide, said first material containing an element having a second oxide-generating Gibbs free energy required to become an oxide and becoming insulative when the element is oxidized; and annealing the first material in an atmosphere containing hydrogen atoms, or heavy hydrogen atoms, and oxygen atoms in a temperature range where the first oxide-generating Gibbs free energy is higher than the second oxide-generating Gibbs free energy, the annealing being conducted to oxidize the first material and to prevent forming an oxide of the semiconductor layer at an interface between the semiconductor layer and the first material;

wherein in the annealing of the first material, the first material is annealed in an atmosphere containing H radicals, O radicals, and OH radicals; or D radicals, OD radicals, and O radicals; the H radicals, O radicals, and OH radicals are generated by discharging in an atmosphere containing water; or the D radicals, OD radicals, and the O radicals are generated by discharging in an atmosphere containing heavy water, wherein the first material contains at least one material from among Si, Zr, Hf, Ti, Al, La, Pr, Y, Ce, Sr, Dy, Er, Lu and Gd.

2. The method according to claim 1, wherein the second material contains at least one material from among W, Pt, Au, Cu, Ta, Mo, Ir, Ru, Ni, Ge, Ga and As.

3. The method according to claim 1, wherein a temperature range in the annealing of the first material is not higher than 700°C.

4. The method according to claim 1, wherein a temperature range in the annealing of the first material is not higher than 500°C.

5. The method according to claim 1, wherein, in the annealing of the first material, a ratio of partial pressures of hydrogen and water vapor ($PH_2/PH_2O$) in an atmosphere of the annealing is not higher than $1 \times 10^6$.

6. The method according to claim 1, wherein a thickness of the first material is not larger than 20 nm.

7. A method of manufacturing a semiconductor device comprising:

forming a first material for a gate insulator on a semiconductor layer, the semiconductor layer being made of germanium or gallium arsenide having a first oxide-generating Gibbs free energy required to become an oxide, said first material containing an element having a second oxide-generating Gibbs free energy required to become an oxide and becoming insulative when the element is oxidized; and forming a second material for a gate electrode on the first material, said second material containing an element having a third oxide-generating Gibbs free energy required to become an oxide; and annealing the first material in a temperature range where the first oxide-generating Gibbs free energy and the third oxide-generating Gibbs free energy are higher than the second oxide-generating Gibbs free energy, the annealing being conducted to oxidize the first material, the annealing being conducted to prevent forming an oxide of the semiconductor layer at an interface between the semiconductor layer and the first material and to prevent forming an oxide of the second material at an interface between the first material and the second material, wherein the first material contains at least one material from among Si, Zr, Hf, Ti, Al, La, Pr, Y, Ce, Sr, Dy, Er, Lu and Gd.

8. The method according to claim 7, wherein a sum of a thickness of the first material and a thickness of the second material is not larger than 20 nm.

9. The method according to claim 7, wherein, in the annealing of the first material, the first material is annealed in an atmosphere containing H radicals, O radicals, and OH radicals; or D radicals, OD radicals, and O radicals.

10. The method according to claim 7, wherein the H radicals, O radicals, and OH radicals are generated by discharging in an atmosphere containing water; or the D radicals, the OD radicals, and the O radicals are generated by discharging in an atmosphere containing heavy water.

11. The method according to claim 7, wherein a temperature range in the annealing of the first material is not higher than 700° C.

12. The method according to claim 7, wherein a temperature range in the annealing of the first material is not higher than 500° C.

13. The method according to claim 7, wherein, in the annealing of the first material, a ratio of partial pressures of hydrogen and water vapor ($PH_2/PH_2O$) in an atmosphere of the annealing is not higher than $1 \times 10^6$.

14. A method of manufacturing a semiconductor device comprising:
    forming a first oxide film for a gate insulator on a semiconductor layer, the semiconductor layer being made of germanium or gallium arsenide having a first oxide-generating Gibbs free energy required to become an oxide, said first oxide film containing an element having a second oxide-generating Gibbs free energy required to become an oxide and becoming insulative when the element is oxidized, wherein a second oxide film of the semiconductor layer is formed between the first oxide film and the semiconductor layer, when the first oxide film is formed; and
    the method further comprising:
    annealing the second oxide film in an atmosphere containing H radicals, O radicals and OH radicals, or D radicals, OD radicals and O radicals in a temperature range where the first oxide-generating Gibbs free energy is higher than the second oxide-generating Gibbs free energy, the annealing being conducted for deoxidation of the second oxide films and to prevent forming an oxide of the semiconductor layer at an interface between the semiconductor layer and the second oxide film,
    wherein the H radicals, O radicals and OH radicals are generated by discharging in an atmosphere containing water, or the D radicals, OD radicals and the O radicals are generated by discharging in an atmosphere containing heavy water.

15. A method of manufacturing a semiconductor device comprising:
    forming a first oxide film for a gate insulator on a semiconductor layer, the semiconductor layer being made of germanium or gallium arsenide having a first oxide-generating Gibbs free energy required to become an oxide, said first oxide film containing an element having a second oxide-generating Gibbs free energy required to become an oxide and becoming insulative when the element is oxidized, wherein a second oxide film of the semiconductor layer is formed between the first oxide film and the semiconductor layer, when the first oxide film is formed; and
    the method further comprising:
    forming a second material for a gate electrode on the first oxide film, said second material containing an element having a third oxide-generating Gibbs free energy required to become an oxide, wherein a third oxide film and a fourth oxide film of the second material are respectively formed between the second material and the first oxide film and on a surface of the second material, when the second material is formed, and
    the method further comprising:
    annealing the second, the third and the fourth oxide films in an atmosphere containing H radicals, O radicals and OH radicals, or D radicals, OD radicals and O radicals in a temperature range where the first oxide-generating Gibbs free energy and the third oxide-generating Gibbs free energy are higher than the second oxide-generating Gibbs free energy, the annealing being conducted to oxidize the first oxide film, the annealing being conducted for de-oxidation of the second, the third and the fourth oxide films, and the annealing being conducted to prevent forming an oxide of the semiconductor layer at an interface between the semiconductor layer and the second oxide film,
    wherein the H radicals, O radicals and OH radicals are generated by discharging in an atmosphere containing water, or the D radicals, OD radicals and the O radicals are generated by discharging in an atmosphere containing heavy water.

* * * * *